US012787877B2

(12) United States Patent
Hsu et al.

(10) Patent No.: US 12,787,877 B2
(45) Date of Patent: Nov. 3, 2026

(54) MICRO LIGHT EMITTING DIODE CHIP AND DISPLAY DEVICE

(71) Applicant: Xiamen Extremely PQ Display Technology Co., Ltd., Xiamen (CN)

(72) Inventors: Chen-Ke Hsu, Xiamen (CN); Xiangwei Xie, Xiamen (CN); Tung-Kai Liu, Xiamen (CN)

(73) Assignee: XIAMEN EXTREMELY PQ DISPLAY TECHNOLOGY CO., LTD., Xiamen (CN)

(*) Notice: Subject to any disclaimer, the term of this patent is extended or adjusted under 35 U.S.C. 154(b) by 356 days.

(21) Appl. No.: 18/392,121

(22) Filed: Dec. 21, 2023

(65) Prior Publication Data

US 2024/0128244 A1 Apr. 18, 2024

Related U.S. Application Data

(63) Continuation of application No. PCT/CN2021/123900, filed on Oct. 14, 2021.

(51) Int. Cl.
*H10W 90/00* (2026.01)
*H10H 20/82* (2025.01)

(52) U.S. Cl.
CPC ............ *H10W 90/00* (2026.01); *H10H 20/82* (2025.01)

(58) Field of Classification Search
CPC ...................................................... H10H 20/82
See application file for complete search history.

(56) References Cited

U.S. PATENT DOCUMENTS

| | | | | |
|---|---|---|---|---|
| 2011/0233558 A1* | 9/2011 | Lee | H10H 20/811 | 257/E33.056 |
| 2011/0248237 A1* | 10/2011 | Choi | H10H 20/857 | 257/13 |
| 2013/0119424 A1* | 5/2013 | Kang | H10H 20/82 | 257/98 |
| 2014/0159082 A1* | 6/2014 | Huang | H10H 20/82 | 257/95 |

(Continued)

FOREIGN PATENT DOCUMENTS

| | | |
|---|---|---|
| CN | 101673792 B | 9/2011 |
| CN | 104218134 A | 12/2014 |

(Continued)

*Primary Examiner* — Evren Seven
(74) *Attorney, Agent, or Firm* — WPAT, PC

(57) ABSTRACT

A micro-LED chip includes an epitaxial structure, which includes first and second doped type semiconductor layers and an active layer disposed between the first and second doped type semiconductor layers; a light-emitting side of the first doped type semiconductor layer facing away from the active layer is provided with a patterned structure; and an elongated edge a of the micro-LED chip, a thickness b of the micro-LED chip, and a peak-valley height difference c of the patterned structure satisfy: 0.01≤b/a≤6, and 0.01≤c/b≤0.3. By designing a structure size and/or a shape of the micro-LED chip combined with designing the peak-valley height difference of the patterned structure to satisfy the condition of 0.01≤c/b≤0.3, power of laser lift-off operation can be reduced and a process window thereof is enlarged, and light extraction efficiency of the micro-LED chip is achieved. And a display device using the micro-LED chip is provided.

10 Claims, 3 Drawing Sheets

(56) References Cited

U.S. PATENT DOCUMENTS

| | | | | |
|---|---|---|---|---|
| 2018/0287013 | A1* | 10/2018 | Lee | H10H 20/82 |
| 2020/0075805 | A1 | 3/2020 | Lai et al. | |
| 2021/0210664 | A1* | 7/2021 | Huang | H10H 20/841 |
| 2022/0316663 | A1* | 10/2022 | Wildeson | F21K 9/68 |
| 2023/0411562 | A1* | 12/2023 | Check | H10H 20/833 |

FOREIGN PATENT DOCUMENTS

| | | | | | |
|---|---|---|---|---|---|
| CN | 105247676 | A | | 1/2016 | |
| CN | 103325913 | B | | 6/2017 | |
| CN | 108140667 | A | | 6/2018 | |
| CN | 108470804 | A | | 8/2018 | |
| CN | 109496368 | A | | 3/2019 | |
| CN | 110311029 | A | | 10/2019 | |
| CN | 111201617 | A | | 5/2020 | |
| CN | 111480241 | A | | 7/2020 | |
| CN | 112289902 | A | | 1/2021 | |
| CN | 112993116 | A | | 6/2021 | |
| JP | 2005064247 | A | | 3/2005 | |
| KR | 20110120388 | A | * | 11/2011 | H10H 20/819 |
| TW | 201424040 | A | * | 6/2014 | H10H 20/82 |
| WO | WO-2021126445 | A1 | * | 6/2021 | H10P 14/3416 |

* cited by examiner

MICRO LIGHT EMITTING DIODE CHIP AND DISPLAY DEVICE

CROSS-REFERENCE TO RELATED APPLICATION

This application is a continuation of International Application No. PCT/CN2021/123900, filed on Oct. 14, 2021, the disclosure of which is incorporated herein by reference in its entirety.

TECHNICAL FIELD

The disclosure relates to the technical field of solid-state light-emitting devices, and more particularly to a micro light emitting diode (micro-LED) chip and a display device using the micro-LED chip.

BACKGROUND

Micro-LED chips generally refer to semiconductor light-emitting diode chips with a length, a width, and a thickness of less than 100 μmicrometers (μm). In order to break total reflection to improve light extraction efficiency (also referred to as extraction efficiency) of the micro-LED chip, the related art manufactures the micro-LED chip by processing a traditional patterned sapphire substrate (PSS). However, during a process of laser lift-off (LLO) the traditional patterned sapphire substrate, the required laser energy is high and a process window thereof is small. Furthermore, yield of the laser lift-off processing is low, or the micro-LED chip is damaged or broken.

SUMMARY

Therefore, in order to overcome at least some defects and deficiencies in the related art, embodiments of the disclosure provide a micro light emitting diode (micro-LED) chip and a display device using the micro-LED chip.

In a first aspect, an embodiment of the disclosure provides the micro-LED chip, including: an epitaxial structure; the epitaxial structure includes: a first doped type semiconductor layer, a second doped type semiconductor layer, and an active layer disposed between the first doped type semiconductor layer and the second doped type semiconductor layer; a light-emitting side of the first doped type semiconductor layer facing away from the active layer is provided with a patterned structure; an elongated edge a of the micro-LED chip, a thickness b of the micro-LED chip, and a peak-valley height difference c of the patterned structure satisfy the following formula: $0.01 \leq b/a \leq 6$, and $0.01 \leq c/b \leq 0.3$.

In an embodiment of the disclosure, the peak-valley height difference c of the patterned structure is less than 1 μmicrometer (μm).

In an embodiment of the disclosure, the peak-valley height difference c of the patterned structure is greater than or equal to 0.1 μm and less than 1 μm.

In an embodiment of the disclosure, the peak-valley height difference c of the patterned structure is less than 0.1 μm.

In an embodiment of the disclosure, the elongated edge a of the micro-LED chip is less than 100 μm, and the thickness b of the micro-LED chip is less than 20 μm.

In an embodiment of the disclosure, the patterned structure is a two-dimensional photonic crystal structure.

In an embodiment of the disclosure, the peak-valley height difference c of the patterned structure is less than or equal to 1.5 μm.

In an embodiment of the disclosure, the patterned structure is disposed on the light-emitting side of the first doped type semiconductor layer facing away from the active layer by performing a pattern transfer method on a growth substrate formed with the pattern structure.

In an embodiment of the disclosure, the patterned structure is disposed on the light-emitting side of the first doped type semiconductor layer facing away from the active layer by using a dry etching method after performing a laser lift-off (LLO) processing on a growth substrate.

Furthermore, in a second aspect, another embodiment of the disclosure provides a micro-LED chip, including an epitaxial structure; the epitaxial structure has no growth substrate and has no bonding substrate for supporting the epitaxial structure, and the epitaxial structure includes: a first doped type semiconductor layer, a second doped type semiconductor layer, and an active layer disposed between the first doped type semiconductor layer and the second doped type semiconductor layer; a light-emitting side of the first doped type semiconductor layer facing away from the active layer is provided with a patterned structure and a peak-valley height difference of the patterned structure is less than 1 μm; an elongated edge of the micro-LED chip is less than 100 μm, a thickness of the micro-LED chip is less than or equal to 10 μm; and the thickness of the micro-LED chip and the peak-valley height difference of the patterned structure satisfy the following formula: $0.01 \leq c/b \leq 0.3$.

In addition, in a third aspect, an embodiment of the disclosure provides a display device, including: a circuit substrate and multiple micro-LED chips; each of the multiple micro-LED chips is the micro-LED chip as mentioned in any one of the foregoing embodiments; the circuit substrate is provided with multiple electrode structures, and each of the multiple electrode structures includes a first electrode and a second electrode disposed in pairs; and the multiple micro-LED chips are disposed on the circuit substrate, and the multiple micro-LED chips are electrically connected to the multiple electrode structures, respectively.

As can be seen from the above description, by designing a structure size and/or a shape of the micro-LED chip, for example, designing the peak-valley height difference of the patterned structure to satisfy the condition of $0.01 \leq c/b \leq 0.3$ combined with the design of the photonic crystal structure, the light extraction efficiency of the micro-LED chip is optimized, and then power of the laser lift-off processing can be reduced and the process window of the laser lift-off processing is enlarged; moreover the micro-LED chip is not easily damaged and the light extraction efficiency thereof is improved.

BRIEF DESCRIPTION OF DRAWINGS

In order to illustrate technical solutions of the embodiments of the disclosure more clearly, attached drawings that need to be used in the embodiments are briefly described below. Apparently, the attached drawings described below are merely some of the embodiments of the disclosure, and for those skilled in the related art, other drawings can be obtained according to these drawings without involving any inventive effort.

DETAILED DESCRIPTION OF EMBODIMENTS

In order to make objectives, technical solutions and advantages of embodiments of the disclosure clearer, the technical solutions in the embodiments of the disclosure will be clearly and completely described below with reference to attached drawings. Apparently, the described embodiments are merely some of the embodiments of the disclosure, rather than all of the embodiments. All other embodiments obtained by those skilled in the related art based on the embodiments described in the disclosure without creative efforts shall fall within the scope of the protection of the disclosure.

It should be noted that all directional indications (such as upper, lower, left, right, front, and back) in the embodiments of the disclosure are only used to explain relative position relationship, motion situation, etc. between components under a specific posture (as shown in the attached drawings), and if the specific posture changes, the directional indication also changes accordingly.

Description, such as "first", "second", etc., in the embodiments of the disclosure are only used for descriptive purposes, and cannot be understood as indicating or implying their relative importance or implicitly indicating a number of indicated technical features. Thus, the technical features defined with "first" and "second" may explicitly or implicitly include at least one of the technical features.

Embodiment 1

Figure 1:
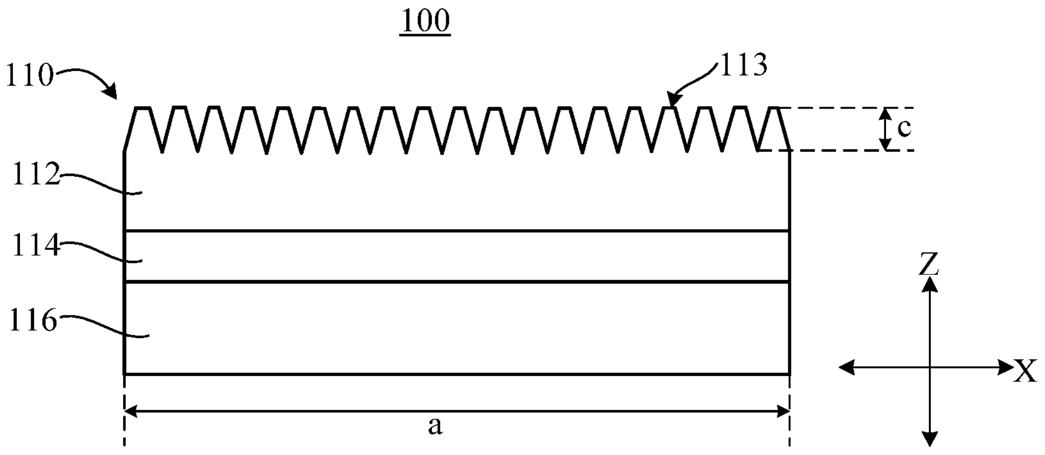
FIG. 1 illustrates a schematic structural diagram of a micro light emitting diode chip according to an embodiment 1 of the disclosure.

With reference to FIG. 1, a micro light emitting diode (micro-LED) chip 100 according to the embodiment 1 of the disclosure includes an epitaxial structure 110; the epitaxial structure 110 has no growth substrate and has no bonding substrate for supporting the epitaxial structure 110, and the bonding substrate described herein generally refers to a substrate connected to the epitaxial structure 110 by a bonding process (e.g., a metal bonding process). The epitaxial structure 110 includes: a first doped type semiconductor layer 112, a second doped type semiconductor layer 116, and an active layer 114 (e.g., a multiple quantum well (MQW) layer) disposed between the first doped type semiconductor layer 112 and the second doped type semiconductor layer 116, and a side of the first doped type semiconductor layer 112 facing away from the active layer 114 (i.e., a light-emitting side of the micro-LED chip 100) is provided with a patterned structure 113, such as a microstructure array. It can be understood that, in addition to the epitaxial structure 110, the micro-LED chip 100 of the embodiment 1 is further provided with a first electrode (not shown in FIG. 1) electrically connected to the first doped type semiconductor layer 112 and a second electrode (not shown in FIG. 1) electrically connected to the second doped type semiconductor layer 116. However, the embodiment 1 of the disclosure only focuses on describing the epitaxial structure 110 with the patterned structure 113, specific descriptions of the first electrode and the second electrode will be omitted below. In addition, it is worth mentioning that by taking a blue micro-LED chip as an example, the epitaxial structure 110 of the embodiment 1 may also be additionally provided with other functional layers according to actual needs, such as an unintentional doped gallium nitride (u-GaN) layer, a stress release layer disposed between an N-type semiconductor layer (referred to as a semiconductor layer containing a negative electrode) and the MQW layer, an electron blocking layer (EBL) disposed between the MQW layer and a P-type semiconductor layer (referred to as a semiconductor layer containing a positive electrode), etc., but the embodiment 1 of the disclosure is not limited thereto.

Taking the blue micro-LED chip as an example, the first doped type semiconductor layer 112 is an N-type gallium nitride (GaN) layer, the second doped type semiconductor layer 116 is a P-type GaN layer, and the active layer 114 is an indium gallium nitride (InGaN)/GaN multiple quantum well layer. It should be noted that the micro-LED chip 100 of the embodiment 1 is not limited to the blue micro-LED chip, or may be micro-LED chips with other color lights, such as a green micro-LED chip, a red micro-LED chip, etc., thereby that composition and material of each layer in the epitaxial structure 110 need to be adjusted accordingly, but a substitution of the micro-LED chips with other color lights is an existing mature technology. Therefore, details are not described herein again.

As described above, in the related art, a conventional patterned sapphire substrate (PSS) structure is used to manufacture the micro-LED chip, and a peak-valley height difference of a microstructure array on the PSS structure is greater than 2.5 micrometers (μm). Therefore, during a manufacturing process of the micro-LED chip, a free-standing chip on carrier (F-COC) structure needs to be manufactured, which needs to use micro-adhesive glue to micro-bond a surface of the micro-LED chip for temporary fixation, and then needs to remove a substrate by laser lift-off processing. In the foregoing process, due to the peak-valley height difference of the microstructure array on the surface of the conventional PSS structure is large, the laser energy required for the laser lift-off processing is high and the process window of the laser lift-off processing is small, which easily leads to a low yield of the laser lift-off processing, or causes damage or breakage to the micro-LED chip. The embodiment 1 aims to reduce the laser energy of the laser lift-off processing and to increase the process window of the laser lift-off processing, thereby to overcome the technical problems of low yield of the laser lift-off processing or chip damage or breakage that may occur in the related art. Therefore, a structure size and/or a shape of the micro-LED chip 100 is designed, for example, an elongated edge a of the micro-LED chip 100 (i.e., a length a in an X direction or a horizontal direction illustrated in FIG. 1), a thickness b of the micro-LED chip 100 (i.e., a height in a Z direction or a vertical direction illustrated in FIG. 1, not labeled), and a peak-valley height difference c of the patterned structure 113 (i.e., a height c in the Z direction illustrated in FIG. 1) satisfy the following formula: $0.01 \le b/a \le 6$, and $0.01 \le c/b \le 0.3$. Specially, b is defined as an overall thickness of the micro-LED chip 100 in the Z direction, and b/a mainly indicates the size of the micro-LED chip 100 (typically, $b/a \le 1$). Moreover, the value of the thickness b can be determined by a thickness of the epitaxial structure 110, a thickness of an electrode in the micro-LED chip 100, and an etching depth of the semiconductor layer (e.g., a depth of mesa etching). The condition of $0.01 \le b/a \le 6$ represents that the elongated edge a of the micro-LED chip 100 can be greater than the thickness b of the micro-LED chip 100 (e.g., $0.01 \leq b/a \leq 1$), so that the shape of the micro-LED chip 100 looks long but thin, which enables a display device using the micro-LED chip 100 thin. In addition, the elongated edge a of the micro-LED chip 100 can also be less than the thickness b of the micro-LED chip 100 (e.g., $1 \leq b/a \leq 3$), so that the shape of the micro-LED chip 100 looks short and thick, which enables a display device using the micro-LED chip 100 have a high pixel density. The condition of $0.01 \leq c/b \leq 0.3$ can prevent the micro-LED chip 100 from being easily damaged due to a large drop in surface roughening, while improving light extraction efficiency.

In an illustrated embodiment, a specific size design of the peak-valley height difference c of the patterned structure 113 is set to be less than or equal to 1.5 micrometers (μm); more specially, the specific size design of the peak-valley height difference c of the patterned structure 113 is set to be at a sub-micron level or even at a nanoscale, and the sub-micron level described herein refers to the peak-valley height difference c of the patterned structure 113 (i.e., the height difference in the Z direction illustrated in FIG. 1, or referring as to a drop in surface roughening) that satisfies the condition of $0.1\ \mu m \leq c < 1\ \mu m$; and the nanoscale refers to that the peak-valley height difference c of the patterned structure 113 satisfies the condition of $c < 0.1\ \mu m$ (i.e., less than 100 nanometers abbreviated as nm). In an illustrated embodiment of the disclosure, $a < 100\ \mu m$ (even less than 10 μm), $b < 20\ \mu m$ (more specifically $b \leq 10\ \mu m$), and $c \leq 1.5\ \mu m$; therefore, the thickness of the epitaxial structure 110 is less than 10 μm (specifically in a range of 2 μm to 6 μm, e.g., a range of 3 μm to 5 μm), but the embodiment 1 of the disclosure is not limited thereto.

In addition, each microstructure in the patterned structure 113 can be a stripe, a dome, a columnar shape, etc., which is not specifically limited herein. As long as that the microstructure can break total reflection to improve the light extraction efficiency (also referred to as extraction efficiency) of the micro-LED chip 100, the patterned structure 113 can be manufactured in any size.

In addition, in order to more clearly understand the micro-LED chip 100 of the embodiment 1, an illustrative manufacturing method of the micro-LED chip 100 of the embodiment 1 is briefly described below by taking the blue micro-LED chip as an example, and the manufacturing method specifically includes the following steps.

Figure 2A:
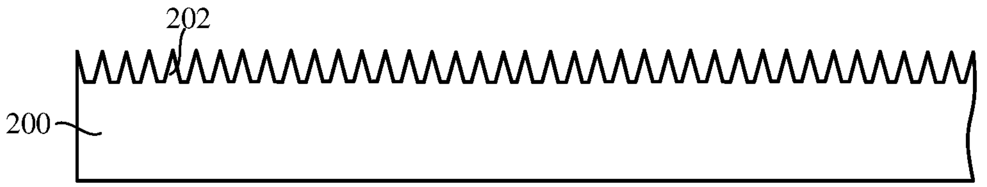
FIGS. 2A to 2E illustrate schematic structural diagrams of a manufacturing method of the micro light emitting diode chip according to the embodiment 1 of the disclosure.

First, as shown in FIG. 2A, a patterned sapphire substrate 200 is used as a growth substrate, and the patterned sapphire substrate 200 described herein refers to a sapphire substrate formed with a patterned structure 202 formed on a surface thereof.

Figure 2B:
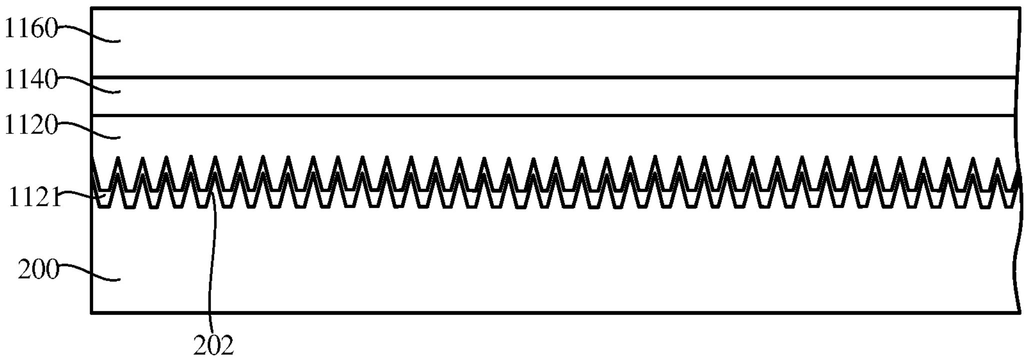

Next, as shown in FIG. 2B, a buffer layer 1121, an N-type semiconductor layer 1120, an active layer 1140 (e.g., an MQW layer), and a P-type semiconductor layer 1160 are epitaxially grown on the surface of the patterned sapphire substrate 200 formed with the patterned structure 202.

Figure 2C:
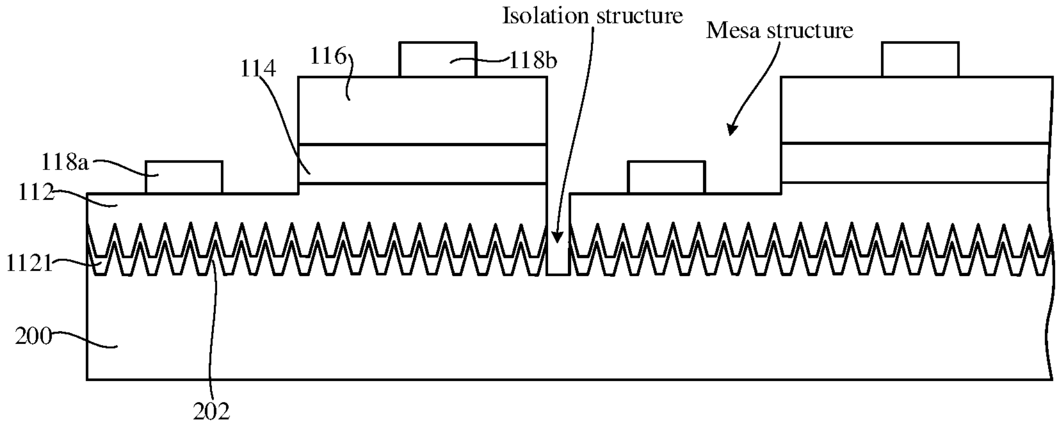

Then, the micro-LED chip 100 is manufactured by chip on wafer (COW). Specially, a mesa structure is manufactured on the blue micro-LED chip by using a dry etching method with inductive coupled plasma (ICP), and then an isolation structure is manufactured on the blue micro-LED chip, and more particularly, the P-type semiconductor layer 1160 and the active layer 1140 are etched by the ICP method until the N-type semiconductor layer 1120 is removed partially to form the mesa structure, thereby partially exposing the N-type semiconductor layer 1120; then the patterned sapphire substrate 200 is further etched by the ICP method to form the isolation structure, which can define multiple micro-LED chips. It is also possible to manufacture the isolation structure first, and then to manufacture the mesa structure. After forming the mesa structure and the isolation structure, an N electrode 118*a* and a P electrode 118*b* electrically connected to, i.e., ohmic contacts, the N-type semiconductor layer 1120 (corresponding to the first doped type semiconductor layer 112) and the P-type semiconductor layer 1160 (corresponding to the second doped type semiconductor layer 116), respectively, are formed, as shown in FIG. 2C.

Figure 2D:
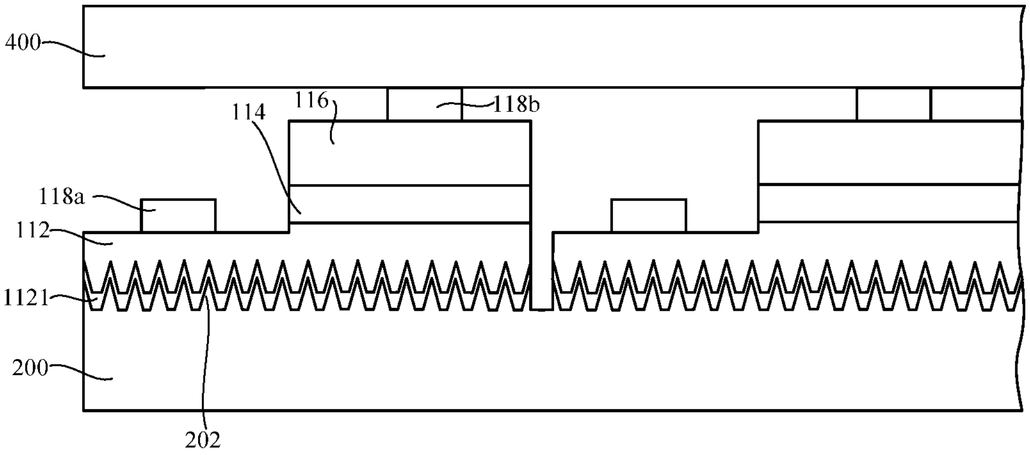

Next, the aforementioned COW structure formed with the mesa structure, the isolation structure, the N electrode 118*a*, and the P electrode 118*b* is temporarily fixed to a temporary substrate 400 by using a micro-adhesive, as shown in FIG. 2D.

Figure 2E:
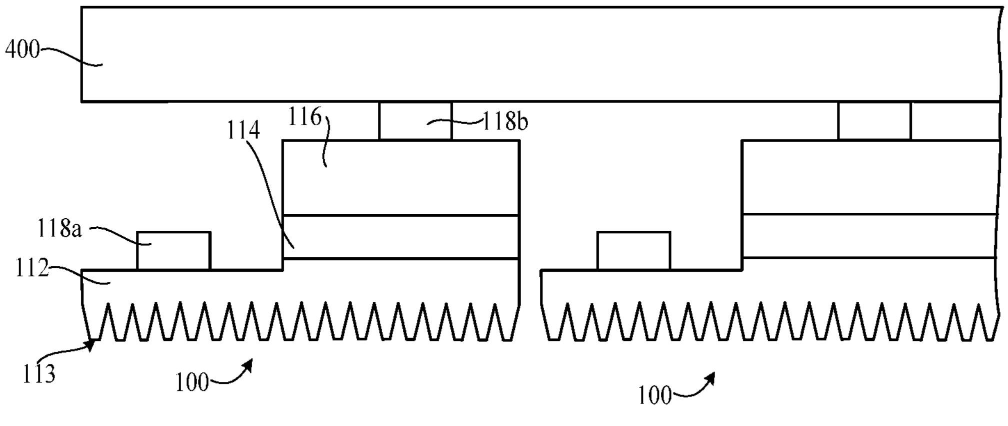

Finally, the patterned sapphire substrate 200 is removed by the laser lift-off processing, and the buffer layer 1121 is removed by laser ablation, thereby obtaining the multiple micro-LED chips temporarily fixed to the temporary substrate 400, that is, the multiple micro-LED chips 100 temporarily fixed to the temporary substrate 400, as shown in FIG. 2E. It should be noted that the multiple micro-LED chips 100 shown in FIG. 2E is a same component as the micro-LED chip 100 shown in FIG. 1, but the micro-LED chip 100 shown in FIG. 1 omits illustrating the N electrode 118*a* and the P electrode 118*b*. In the embodiment 1, the patterned structure 202 of the patterned sapphire substrate 200 is transferred to a light-emitting side of the N-type semiconductor layer (the first doped type semiconductor layer 112) to form the patterned structure 113 (as shown in FIG. 1 or FIG. 2E), and the peak-valley height difference c of the patterned structure 113 is preferably less than or equal to 1.5 μm, more specially at the sub-micron level or the nanoscale. Moreover, it can be seen from FIG. 2E that the patterned structure 113 and the N-type semiconductor layer 112 are of an integrated structure, that is, the patterned structure 113 is directly formed on the N-type semiconductor layer 112 and is made of a same material as that of the N-type semiconductor layer 112.

Embodiment 2

Figure 3:
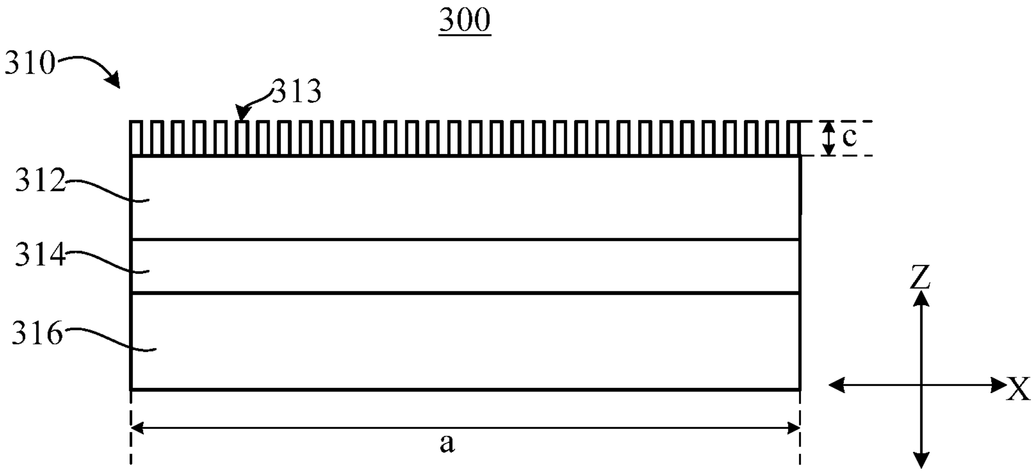
FIG. 3 illustrates a schematic structural diagram of a micro light emitting diode chip according to an embodiment 2 of the disclosure.

With reference to FIG. 3, a micro-LED chip 300 according to the embodiment 2 of the disclosure includes an epitaxial structure 310 that has no growth substrate and has no bonding substrate for supporting the epitaxial structure 310. The epitaxial structure 310 includes: a first doped type semiconductor layer 312, a second doped type semiconductor layer 316, and an active layer 314 (e.g., a MQW layer) disposed between the first doped type semiconductor layer 312 and the second doped type semiconductor layer 316, and a side of the first doped type semiconductor layer 312 facing away from the active layer 314 (i.e., a light-emitting side of the micro light emitting diode chip 300) is provided with a patterned structure 313, such as a two-dimensional photonic crystal structure. It can be understood that, in addition to the epitaxial structure 310, the micro-LED chip 300 of the embodiment 2 is further provided with a first electrode (not shown in FIG. 3) electrically connected to the first doped type semiconductor layer 312 and a second electrode (not shown in FIG. 3) electrically connected to the second doped type semiconductor layer 316. However, the embodiment 2 of the disclosure only focuses on describing the epitaxial structure 310 with the patterned structure 313, specific descriptions of the first electrode and the second electrode (with reference to the N electrode 118*a* and the P electrode 118*b* shown in FIG. 2E) will be omitted below. In addition, it is worth mentioning that by taking a blue micro-LED chip as an example, the epitaxial structure 310 of the embodiment 2 may also be additionally provided with other functional layers according to actual needs, such as an unintentional doped gallium nitride (u-GaN) layer, a stress release layer disposed between an N-type semiconductor layer and the MQW layer, an electron blocking layer disposed between the MQW layer and a P-type semiconductor layer, etc., but the embodiment 2 of the disclosure is not limited thereto.

Taking the blue micro-LED chip as an example, the first doped type semiconductor layer 312 is an N-type gallium nitride (GaN) layer, the second doped type semiconductor layer 316 is a P-type GaN layer, and the active layer 314 is an indium gallium nitride (InGaN)/GaN multiple quantum well layer. It should be noted that the micro-LED chip 300 of the embodiment 2 the blue micro-LED chip, or may be micro-LED chips with other color lights, such as a green micro-LED chip, a red micro-LED chip, etc., thereby that composition and material of each layer in the epitaxial structure 310 need to be adjusted accordingly, but a substitution of the micro-LED chips with other color lights is an existing mature technology. Therefore, details are not described herein again.

As described above, the embodiment 2 designs a structure size and/or a shape of the micro-LED chip 300, for example, an elongated edge a of the micro-LED chip 300 (i.e., a length a in an X direction illustrated in FIG. 3), a thickness b of the micro-LED chip 300 (i.e., a height in a Z direction illustrated in FIG. 3, not labeled), and a peak-valley height difference c of the patterned structure 313 (i.e., a height c in the Z direction illustrated in FIG. 3) satisfy the following formula: $0.01 \leq b/a \leq 6$, and $0.01 \leq c/b \leq 0.3$. Specially, b is defined as an overall thickness of the micro-LED chip 300 in the Z direction, and b/a mainly indicates the size of the micro-LED chip 300 (typically, $b/a \leq 1$). Moreover, the value of the thickness b can be determined by a thickness of the epitaxial structure 310, a thickness of an electrode in the micro-LED chip 300, and an etching depth of the semiconductor layer (e.g., a depth of mesa etching). The condition of $0.01 \leq b/a \leq 6$ represents that the elongated edge a of the micro-LED chip 300 can be greater than the thickness b of the micro-LED chip 300 (e.g., $0.01 \leq b/a < 1$), so that the shape of the micro-LED chip 300 looks long but thin, which enables a display device using the micro-LED chip 300 thin. In addition, the elongated edge a of the micro-LED chip 300 can also be less than the thickness b of the micro-LED chip 300 (e.g., $1 < b/a \leq 3$), so that the shape of the micro-LED chip 300 looks short and thick, which enables a display device using the micro light emitting diode chip 300 have a high pixel density. The condition of $0.01 \leq c/b \leq 0.3$ can prevent the micro-LED chip 300 from being easily damaged due to a large drop in surface roughening, while improving light extraction efficiency.

In an illustrated embodiment, a specific size design of the peak-valley height difference c of the patterned structure 313 (i.e., the two-dimensional photonic crystal structure) is set to be less than or equal to 1.5 μm; more specially, the specific size design of the peak-valley height difference c of the patterned structure 313 is set to be at a sub-micron level or even at a nanoscale, and the sub-micron level described herein refers to the peak-valley height difference c of the patterned structure 313 (i.e., the height difference in the Z direction illustrated in FIG. 3, or referring as to a drop in surface roughening) that satisfies the condition of 0.1 μm≤c<1 μm; the nanoscale refers to that the peak-valley height difference c of the patterned structure 313 satisfies the condition of c<0.1 μm.

In addition, in view of the two-dimensional photonic crystal structure as the patterned structure 313, a lattice type of the two-dimensional photonic crystal structure can be a square lattice, a triangular lattice, or a honeycomb lattice, which is not specifically limited herein. As long as that the two-dimensional photonic crystal structure can improve the light extraction efficiency of the micro-LED chip 300. It should be noted here that the photonic crystal structure has the energy order of photons, which can improve the light extraction efficiency, and can also change/control the light type (light emitting direction) according to requirements, and control the wave band of light.

In addition, in order to more clearly understand the micro-LED chip 300 of the embodiment 2, an illustrative manufacturing method of the micro-LED chip 300 of the embodiment 2 is briefly described below by taking the blue micro-LED chip as an example, and the manufacturing method specifically includes the following steps.

First, a sapphire substrate formed with the two-dimensional photonic crystal structure is manufactured, and specifically includes: depositing a silicon dioxide layer on the sapphire substrate by adopting a process of chemical vapor deposition (CVD), photo-etching on the silicon dioxide layer by adopting an electron beam exposure process to form a pattern of two-dimensional photonic crystal, and removing silicon dioxide in a periodically distributed micro-porous area in the pattern by using dry etching to expose the sapphire substrate, namely forming the two-dimensional photonic crystal structure on the sapphire substrate, also obtaining the sapphire substrate with the patterned structure (i.e., the two-dimensional photonic crystal structure) on the surface thereof.

Next, a non-intentionally doped GaN layer (u-GaN), an N-type GaN layer, an InGaN/GaN MQW layer, and a P-type GaN layer are sequentially epitaxially grown on the sapphire substrate formed with the two-dimensional photonic crystal structure, where the u-GaN is first filled with the periodically distributed micro-porous area.

Then, the micro light emitting diode chip 300 is manufactured by COW. Specially, a mesa structure is manufactured on the blue micro-LED chip by using a dry etching method with inductive coupled plasma (ICP), and then an isolation structure is manufactured on the blue micro-LED chip, which particularly includes: etching the P-type GaN layer and the InGaN/GaN MQW layer by the ICP method until the N-type GaN layer is partially removed to form the mesa structure to partially expose the N-type GaN layer, and then etching the N-type GaN layer by the ICP method to form the isolation structure to define multiple micro-LED chips. It is also possible to manufacture the isolation structure first, and then to manufacture the mesa structure. After forming the mesa structure and the isolation structure, an N electrode and a P electrode electrically connected to the N-type GaN layer and the P-type GaN layer are formed, respectively.

Next, the aforementioned COW structure formed with the mesa structure, the isolation structure, and the N and P electrodes is temporarily fixed to the temporary substrate by using a micro-adhesive.

Furthermore, the sapphire substrate is lifted off by using krypton fluoride (KrF) excimer laser with 248 nm, thereby exposing an interface where the silicon dioxide and the u-GaN layer coexist.

Finally, the u-GaN layer and the silicon dioxide layer in the exposed area are simultaneously lifted off by using the dry etching method until to the N-type GaN layer, which specially includes using a different etch ratio between the GaN layer and the silicon dioxide layer (i.e., 6:1), forming the patterned structure 313 as shown in FIG. 3 on the light-emitting side of the N-type GaN layer (i.e., the first doped type semiconductor layer 312) by using the silicon dioxide layer as a mask layer, thereby obtaining the multiple micro-LED chips with the patterned structure 313 temporarily fixed to the temporary substrate, namely that the multiple micro-LED chips 300 are temporarily fixed to the temporary substrate as shown in FIG. 3. In the embodiment 2, the pattern structure of the two-dimensional photonic crystal on the sapphire substrate formed with the two-dimensional photonic crystal structure is transferred to the u-GaN layer disposed on the light-emitting side of the N-type GaN layer, and the peak-valley height difference c of the patterned structure 313 is less than or equal to 1.5 μm, more specially at the sub-micron level or the nanoscale. Moreover, the patterned structure 313 (i.e., the two-dimensional photonic crystal structure) and the N-type GaN layer (corresponding to the first doped type semiconductor layer 312) together form a two-layer structure, two layers of which are in contact with each other.

It should be noted that the foregoing embodiments of the disclosure uses the growth substrate (such as the sapphire substrate) formed with the patterned structure on the surface thereof to manufacture the micro-LED chip 100/300, so as to transfer the patterned structure 113/313 disposed on the surface of the growth substrate to the light-emitting side of the micro-LED chip 100/300, that is, the patterned structure 113/313 disposed on the light-emitting side of the micro-LED chip 100/300 is obtained by pattern transfer. However, the embodiments of the disclosure are not limited thereto, and a flat substrate can be used as a growth substrate to epitaxially grow a semiconductor layer to manufacture a micro-LED chip without a patterned structure. After the laser lift-off processing is performed on the flat substrate, the dry etching method is used to perform surface roughening treatment on the light-emitting side of the micro-LED chip to form the patterned structure, thereby obtaining the micro-LED chip 100/300 as shown in FIG. 1 or FIG. 3. The dry etching method used herein can avoid damage to the micro adhesive caused by using strong acid and alkali solution for the surface roughening treatment, and further avoid difficulties in subsequent chip transfer process due to chip detachment. At the same time, the disclosure can improve the light extraction efficiency of the micro light emitting diode chip.

In addition, it should be noted that the illustrative manufacturing methods of the foregoing embodiments of the disclosure are to manufacture a flipped micro-LED chip as an example, but the micro-LED chips of the embodiments of the disclosure are not limited to the flipped micro-LED chip, can also be a micro-LED chip with a vertical structure, that is, the P electrode and the N electrode are respectively disposed at a top and a bottom of the micro-LED chip.

Embodiment 3

Figure 4:
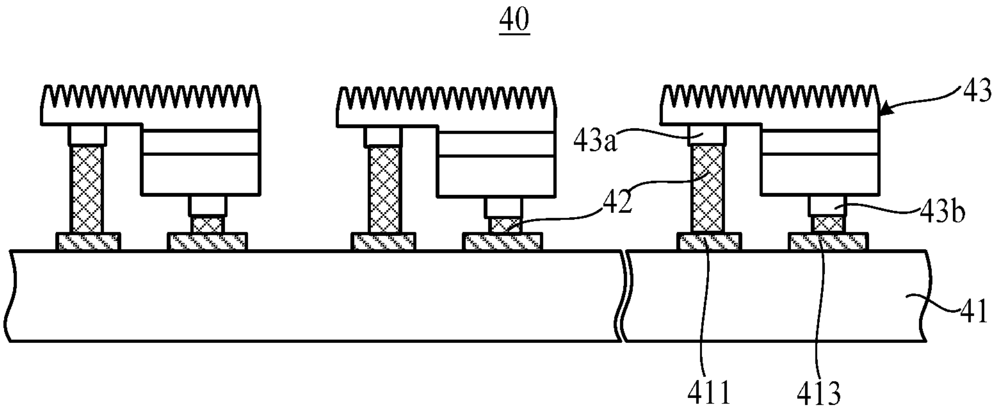
FIG. 4 illustrates a schematic structural diagram of a display device according to an embodiment 3 of the disclosure.

FIG. 4 illustrates a schematic structural diagram of a display device according to an embodiment 3 of the disclosure. As shown in FIG. 4, the display device 40 includes a circuit substrate 41 and multiple micro-LED chips 43 (only three shown in FIG. 4). Specially, the circuit substrate 41 can include multiple electrode structures (only three shown in FIG. 4), and each of the multiple electrode structures disposed in the circuit substrate 41 includes an electrode 411 (also referred to as a first electrode) and an electrode 413 (also referred to as a second electrode) arranged in pairs; the multiple micro-LED chips 43 are disposed on the circuit substrate 41 and are electrically connected to the multiple electrode structures, correspondingly. Specifically, the circuit substrate 41 can be a complementary metal-oxide-semiconductor (CMOS) substrate, a liquid crystal on silicon (LCOS) substrate, a thin film transistor (TFT) substrate, or another substrate possessing working circuit, which is not limited herein. The multiple micro-LED chips 43 can adopt the micro-LED chips with the same color or micro-LED chips with multiple different colors (e.g., red, green, and blue). Moreover, each micro-LED chip 43 can be the micro-LED chip 100 according to the embodiment 1 or the micro-LED chip 300 according to the embodiment 2. Furthermore, the micro-LED chip 43 includes an N electrode 43*a* and a P electrode 43*b*, and the N electrode 43*a* and the P electrode 43*b* are electrically connected to the electrode 411 and the electrode 413, respectively, disposed in the corresponding electrode structure by soldering tin 42. In addition, it can be understood that, in other embodiments, when the micro-LED chip 43 is replaced from the flipped micro-LED chip shown in FIG. 4 into the vertical micro-LED chip, one of the N electrode and the P electrode can be electrically connected to one of the electrode 411 and the electrode 413 in the corresponding electrode structure by the soldering tin 42, and the other one of the N electrode and the P electrode is electrically connected to the other one of the electrode 411 and the electrode 413 in the corresponding electrode structure by wire bonding. It should be noted that the display device 40 of the embodiment 3 can achieve a higher display brightness or lower power consumption by using the micro light emitting diode chip with the higher extraction efficiency.

In addition, it may be understood that the foregoing embodiments are merely illustrative descriptions of the disclosure, and the technical solutions of various embodiments may be combined and used in any combination without departing from the objectives of the disclosure.

It should be noted that the above embodiments are only used to illustrate the technical solutions of the disclosure, but are not limited thereto. Although the disclosure has been described in detail with reference to the foregoing embodiments, it should be understood by those skilled in the related art that the technical solutions recited in the foregoing embodiments can still be modified, or some of the technical features therein can be substituted. However, these modifications or substitutions do not make an essence of the corresponding technical solution separate from the spirit and scope of the technical solutions in the embodiments of the disclosure.

What is claimed is:

1. A micro light emitting diode (micro-LED) chip, comprising an epitaxial structure;

- wherein the epitaxial structure comprises: a first doped type semiconductor layer, a second doped type semiconductor layer, and an active layer disposed between the first doped type semiconductor layer and the second doped type semiconductor layer;
- wherein a light-emitting side of the first doped type semiconductor layer facing away from the active layer is provided with a patterned structure;
- wherein an elongated edge a of the micro-LED chip, a thickness b of the micro-LED chip, and a peak-valley height difference c of the patterned structure satisfy the following formula:

$$0.01 \leq b/a \leq 6 \text{ and } 0.01 \leq c/b \leq 0.3; \text{ and}$$

wherein the peak-valley height difference c of the patterned structure is less than 0.1 μm.

2. The micro-LED chip according to claim 1, wherein the elongated edge a of the micro-LED chip is less than 100 μm, and the thickness b of the micro-LED chip is less than 20 μm.

3. The micro-LED chip according to claim 1, wherein the patterned structure is a two-dimensional photonic crystal structure.

4. The micro-LED chip according to claim 1, wherein the patterned structure is disposed on the light-emitting side of the first doped type semiconductor layer facing away from the active layer by performing a pattern transfer method on a growth substrate formed with the pattern patterned structure.

5. The micro-LED chip according to claim 1, wherein the patterned structure is disposed on the light-emitting side of the first doped type semiconductor layer facing away from the active layer by using a dry etching method after performing a laser lift-off (LLO) processing on a growth substrate.

6. The micro-LED chip according to claim 1, wherein the elongated edge a of the micro-LED chip is a length along a horizontal direction.

7. The micro-LED chip according to claim 1, wherein the peak-valley height difference c of the patterned structure is a height difference between an upper end of the patterned structure facing away from the first doped type semiconductor layer and a lower end of the patterned structure facing towards the first doped type semiconductor layer along a vertical direction.

8. A micro-LED chip, comprising:

an epitaxial structure, wherein the epitaxial structure has no growth substrate and has no bonding substrate for supporting the epitaxial structure, and the epitaxial structure comprises: a first doped type semiconductor layer, a second doped type semiconductor layer, and an active layer disposed between the first doped type semiconductor layer and the second doped type semiconductor layer;

wherein a light-emitting side of the first doped type semiconductor layer facing away from the active layer is provided with a patterned structure, and a peak-valley height difference c of the patterned structure is less than 0.1 μm;

wherein an elongated edge a of the micro-LED chip is less than 100 μm, and a thickness b of the micro-LED chip is less than or equal to 10 μm; and wherein the thickness b of the micro-LED chip and the peak-valley height difference c of the patterned structure satisfy the following formula:

$$0.01 \leq c/b \leq 0.3.$$

9. A display device, comprising:

a circuit substrate, wherein the circuit substrate is provided with a plurality of electrode structures, and each of the plurality of electrode structures comprises a first electrode and a second electrode disposed in pairs; and a plurality of micro-LED chips, wherein each of the plurality of micro-LED chips is the micro-LED chip according to claim 1; and the plurality of micro-LED chips are disposed on the circuit substrate, and the plurality of micro-LED chips are electrically connected to the plurality of electrode structures, respectively.

10. The display device according to 9, wherein the elongated edge a of the micro-LED chip is less than 100 μm, and the thickness b of the micro-LED chip is less than 20 μm.

* * * * *